United States Patent
Talwalkar et al.

(10) Patent No.: US 9,166,577 B2
(45) Date of Patent: Oct. 20, 2015

(54) MODULATION THROUGH DIFFERENTIALLY DELAYED CLOCKS

(71) Applicant: QUALCOMM Incorporated, San Diego, CA (US)

(72) Inventors: Niranjan Anand Talwalkar, San Jose, CA (US); Sanjay Kasturia, Los Altos Hills, CA (US)

(73) Assignee: QUALCOMM Incorporated, San Diego, CA (US)

( * ) Notice: Subject to any disclaimer, the term of this patent is extended or adjusted under 35 U.S.C. 154(b) by 36 days.

(21) Appl. No.: 14/167,972

(22) Filed: Jan. 29, 2014

(65) Prior Publication Data

US 2015/0214939 A1    Jul. 30, 2015

(51) Int. Cl.
 *H03K 7/06* (2006.01)
 *H03K 5/13* (2014.01)
 *H03K 3/017* (2006.01)
 *H03K 7/00* (2006.01)

(52) U.S. Cl.
 CPC ............... *H03K 5/133* (2013.01); *H03K 3/017* (2013.01); *H03K 7/00* (2013.01)

(58) Field of Classification Search
 CPC ........... H03K 3/017; H03K 7/00; H03K 7/06; H03K 7/08; H03K 7/10
 USPC .......... 327/113, 119, 172, 355, 356, 357, 361
 See application file for complete search history.

(56) References Cited

U.S. PATENT DOCUMENTS

| | | | |
|---|---|---|---|
| 6,032,028 A | 2/2000 | Dickey et al. | |
| 6,301,310 B1 | 10/2001 | Jackson et al. | |
| 6,396,869 B1 | 5/2002 | Park et al. | |
| 7,054,382 B2 | 5/2006 | Lee | |
| 8,179,957 B2 | 5/2012 | Bryant | |
| 2009/0146754 A1 | 6/2009 | Bryant | |
| 2009/0311980 A1 | 12/2009 | Sjoland | |
| 2010/0097153 A1 | 4/2010 | Rexberg et al. | |
| 2011/0216818 A1 | 9/2011 | Apostolidou et al. | |
| 2012/0218001 A1* | 8/2012 | Leibowitz et al. ................. | 327/9 |

OTHER PUBLICATIONS

Chung, Sungwon et al., "Asymmetric Multilevel Outphasing Transmitter using Class-E PAs with Discrete Pulse Width Modulation", IMS 2010 2010, pp. 1-4.

Su, D. K., "An IC for Linearizing Power Amplifiers using Envelope Elimination and Restoration", IEEE J.S.S.C vol. 33, No. 12., Dec. 1998, pp. 1-21.

(Continued)

*Primary Examiner* — William Hernandez
(74) *Attorney, Agent, or Firm* — DeLizio Law, PLLC (57) ABSTRACT

A clock modulator can include two configurable delay units and can receive a baseband signal and a clock signal. The two configurable delay units can generate two delayed clock signals, each with different delay amounts. The delay amounts can be based on the baseband signal. The delayed clock signals can be combined to generate a modulated clock signal. A quadrature modulated clock signal can be generated when a first clock modulator receives a first baseband signal and a first clock signal and a second clock modulator receives a second baseband signal and a second clock signal. The first clock signal can be a ninety-degree phase shifted version of the second clock signal. The modulated clock signal from the first clock modulator can be combined with the modulated clock signal from the second clock modulator to generate the quadrature modulated clock signal.

30 Claims, 6 Drawing Sheets

(56) References Cited

OTHER PUBLICATIONS

Wagh, Poojan et al., "An All-digital Universal RF Transmitter", IEEE 2004 Custom Integrated Circuits Conference 2004, pp. 549-552.
Walling, Jeffrey S. et al., "A Class-G Supply Modulator and Class-E PA", IEEE J.S.S.C. vol. 44 No. 9 Sep. 2009, pp. 2339-2347.
Xu, Hongtao et al., "A Flip-Chip-Packaged 25.3 dBm Class-D Outphasing Power Amplifier in 32 nm CMOS for WLAN Application", IEEE Journal of Solid-State Circuits, Vol. 46, No. 7 Jul. 2011, pp. 1596-1605.
Bell Labs et al., "Linear Amplification with Non linear Componets", IEEE Transactions on Communications, IEEE Service Center, Piscataway, NJ, USA, vol. Com-22, No. 12, Dec. 31, 1974, 4 pages.
PCT Application No. PCT/US2015/013245, "Invitation to Pay Additional Fees and Partial Search Report", Apr. 22, 2015, 7 pages.
"PCT Application No. PCT/US2015/013245 International Search Report", Jul. 13, 2015, 17 pages.

\* cited by examiner

MODULATION THROUGH DIFFERENTIALLY DELAYED CLOCKS

BACKGROUND

Embodiments of the inventive subject matter generally relate to the field of communications and, more particularly, to generating a modulated signal using differentially delayed clock signals.

Modulation techniques typically involve a baseband signal and a carrier signal. The baseband signal is a signal that can include information intended for transmission through a medium. The baseband signal can be used to modulate the carrier signal and generate a modulated signal. The modulated signal, carrying the information from the baseband signal, can be transmitted to a receiver. A number of modulation techniques can be used to modulate the carrier signal with the baseband signal. For example, a wireless device, such as an access point, can modulate a signal using Orthogonal Frequency-Division Multiplexing (OFDM) modulation techniques in accordance with IEEE 802.11 specifications. The wireless device can include an OFDM modulator to generate the modulated signal and a transmitter to transmit the modulated signal through the medium.

Transmitting the modulated signal can consume a large amount of power, especially when compared to other circuits and components that may be included in a device with the modulator. Transmitter designs that are more power efficient, such as switched mode transmitters, are often used to reduce power consumption. However, the switching nature of the switched mode transmitter is inherently complex, and does not lend itself to easy implementation with typical signal modulation techniques.

SUMMARY

Various embodiments of a clock modulator are disclosed. In some embodiments, the clock modulator can receive a first clock signal and a first baseband signal. The first clock signal can be delayed to generate a first delayed clock signal and a second delayed clock signal. The amount of delay, for each delayed clock signal, can be based on the first baseband signal. The first delayed clock signal and the second delayed clock signal can be combined to generate a modulated clock signal.

In other embodiments, the clock modulator can receive a first clock signal, a second clock signal, a first baseband signal and a second baseband signal. The second clock signal can be a phase-shifted version of the first clock signal. The first clock signal can be delayed to generate the first and the second delayed clock signals while the second clock signal can be delayed to generate a third delayed clock signal and a fourth delayed clock signals. The first delayed clock signal, the second delayed clock signal, the third delayed clock signal and the fourth delayed clock signal can be combined to generate a quadrature modulated clock signal.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary systems, methods, techniques, instruction sequences and computer program products that embody techniques of the present inventive subject matter. However, it is understood that the described embodiments may be practiced without these specific details. For instance, although examples refer to devices operating in accordance with IEEE 802.11 specifications, other wireless, wired (e.g., Ethernet, power line communications (PLC) and the like) or hybrid devices operating in accordance with other standards or specifications can be used. A hybrid device can include components for both wireless and wired systems. For example, a hybrid device can include wireless components for communicating in accordance with IEEE 802.11 specifications and wired components for communication in accordance with PLC specifications. In other instances, well-known instruction instances, protocols, structures and techniques have not been shown in detail in order not to obfuscate the description.

A first device in a communication network can include a modulator and a transmitter. The first device can communicate with a second device by transmitting a modulated signal to a receiver in the second device. The modulated signal, generated by the modulator, can convey information from the transmitter to the receiver via a communication medium of the network. The information for transmission can be included in a baseband signal. For example, in one modulation scheme a carrier signal is modulated by the baseband signal to generate the modulated signal. The modulated signal can undergo further processing (such as filtering) before being coupled to an amplifier and transmitted.

The amplifier typically adds energy to (e.g., amplifies) the modulated carrier signal to increase transmission range and reliability. As the modulated carrier signal is amplified, distortion may be introduced by the amplifier. Common distortions such as phase distortion, gain distortion and frequency distortion can increase the number of processing steps used to receive and demodulate a transmitted modulated carrier signal. An amplifier with a linear gain inherently has low amounts of distortion. Class A or class A/B amplifier designs are examples of amplifiers with a linear gain. However, class A or class A/B amplifiers can be power inefficient. In some cases, the class A or class A/B amplifiers can be responsible for a large amount of the power consumption of the device. Class D (switched mode) amplifiers may be preferred over class A or class A/B amplifiers since they are typically more power efficient. Class D amplifiers, however, do not typically have a linear gain. As a result, receiving and demodulating the modulated carrier signals from class D amplifiers can require more processing steps compared to more linear amplifiers due, in part, to the added distortion from the amplifier.

In some embodiments, a clock modulator can include two configurable delay units and a combiner. Each configurable delay unit can receive a baseband signal and a clock signal. Each configurable delay unit can delay the clock signal by a delay amount based, at least in part, on the baseband signal. The delay amount provided by each configurable delay unit may be different. A first configurable delay unit can delay the clock signal by a first delay amount to generate a first delayed clock signal. The second configurable delay unit can delay the clock signal by a second delay amount to generate a second delayed clock signal. In one embodiment, an overall delay amount is determined by a time difference between the first delayed clock signal and the second delayed clock signal. The first delayed clock signal and the second delayed clock signal are referred to as differentially delayed clock signals. The differentially delayed clock signals can be combined to generate a modulated clock signal.

In another embodiment, the clock modulator can receive two baseband signals and two clock signals. In one embodiment, the clock signals can be related to each other by a phase shift of approximately ninety-degrees. Clock signals with approximately a ninety-degree phase shift relationship are referred to as quadrature clocks. In this embodiment, the clock modulator can include four configurable delay units and a combiner. A first clock signal and a first baseband signal are coupled to a first configurable delay unit and a second configurable delay unit. As described above, the configurable delay units generate a first delayed clock signal and a second delayed clock signal. A second clock signal and a second baseband signal are coupled to a third configurable delay unit and a fourth configurable delay unit. The third configurable delay unit and the fourth configurable delay unit are similar to the other configurable delay units described above. The third configurable delay unit and the fourth configurable delay unit generate a third delayed clock signal and a fourth delayed clock signal, respectively. The first, second, third and fourth delayed clock signals are combined by a combiner to generate the modulated clock signal, also referred to as a quadrature modulated clock signal.

Figure 1:
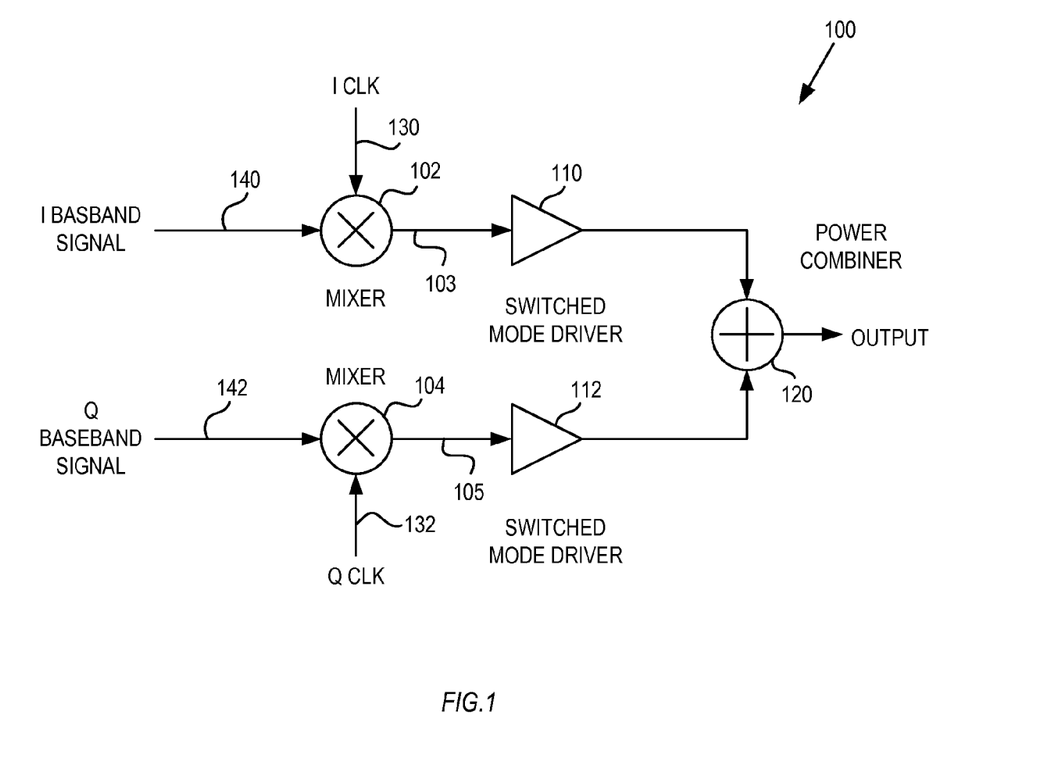
FIG. 1 is a simplified diagram of a clock modulator.

FIG. 1 is a simplified diagram of a clock modulator 100. The simplified diagram highlights conceptual operations of the clock modulator 100. The clock modulator 100 can receive a first baseband signal, a second baseband signal, first clock signal and a second clock signal. The two clock signals can be related to each other by a phase shift. When the phase shift is approximately ninety-degrees, the clock signals are said to be in a quadrature relationship. When the clock signals are in a quadrature relationship, the clock modulator 100 is a quadrature clock modulator.

The first clock signal can be referred to as the I CLK signal 130 (in-phase clock) and a second clock signal can be referred to as the Q CLK signal 132 (quadrature clock). In one embodiment, the I CLK and Q CLK signals 130 and 132 can be approximately 2.4 GHz. In other embodiments, other frequencies may be used. For example, the I CLK and Q CLK signals 130 and 132 can be 1.2 GHz or the I CLK and Q CLK signals 130 and 132 can be 5.4 GHz. The first and the second baseband signals can carry data. For example, the baseband signals can be time varied to carry data. Although time-varying, the baseband signals can be limited to a predetermined bandwidth. For example, the baseband signals can be limited to 50 MHz. In one embodiment, the frequency of the I CLK signal 130 and the Q CLK signal 132 can be at least ten times greater than the bandwidth of the baseband signal. Limiting the bandwidth of the baseband signal with respect to the I CLK signal 130 and the Q CLK signal 132 can reduce non-linear modulation of I CLK signal 130 and the Q CLK signal 132. Modulation of these clock signals is described in more detail below. The first baseband signal can be referred to as an I baseband signal 140 and the second baseband signal can be referred to as a Q baseband signal 142.

The I CLK signal 130 and the I baseband signal 140 are coupled to mixer 102. The mixer 102 can multiply (or "mix") signals together. Conceptually, mixing two signals creates a signal with at least two components, a "sum" component and a "difference" component. For example, the results of mixing two signals F1 and F2 generates a signal with a F1+F2 (sum) component and a F1−F2 (difference) component. When the signal F1 is a signal with a first frequency and the signal F2 is a signal with a second frequency, then mixing signals F1 and F2 generates a signal with a first component that has a frequency based on the first frequency plus the second frequency and a second component based on the first frequency minus the second frequency. Often, the output of the mixer is filtered to remove one of the two components. The mixing operation can be performed with analog multipliers or digital multipliers. When one of the two signals provided to a mixer is a variable signal (e.g., a time varying or frequency varying signal), the output of the mixer is said to be a modulated signal. The variable signal is said to modulate a non-varying signal through the mixer. The non-varying signal can be a clock signal, such as the I CLK signal 130. The frequency of the I CLK signal 130 can be constant. The variable signal can be a time varying data signal such as I baseband signal 140 or Q baseband signal 142.

The I baseband signal 140 and the I CLK signal 130 can be mixed together with the mixer 102 to generate a first modulated clock signal 103. That is, the I CLK signal 130 is modulated by the I baseband signal 140 to generate the first modulated clock signal 103. In a similar manner, the mixer 104 can mix the Q baseband signal 142 and the Q CLK signal 132 together to generate a second modulated clock signal 105. That is, the Q CLK signal 132 is modulated by the Q baseband signal 142 to generate the second modulated clock signal 105. In one embodiment, the I baseband signal 140 and the Q baseband signal 142 are variable signals (time varying or frequency varying) and the I CLK signal 130 and the Q CLK signal 132 are non-varying signals.

The mixer 102 is coupled to a switched mode driver 110. The switched mode driver 110 can amplify the first modulated clock signal 103 received from the mixer 102. Similarly, the mixer 104 is coupled to a switched mode driver 112 that can amplify the second modulated clock signal 105 received from the mixer 104. The outputs of the switched mode drivers 110 and 112 are coupled to a power combiner 120. The power combiner 120 can sum together (i.e., combine) the output of the switched mode driver 110 and the output of the switched mode driver 112. Since the I CLK signal 130 and the Q CLK signal 132 have a quadrature relationship, the output of the power combiner 120 can include the first modulated clock signal 103 (amplified) in quadrature with the second modulated clock signal 105 (amplified). The output of the power combiner 120 can be referred to as a quadrature modulated clock signal.

Figure 2:
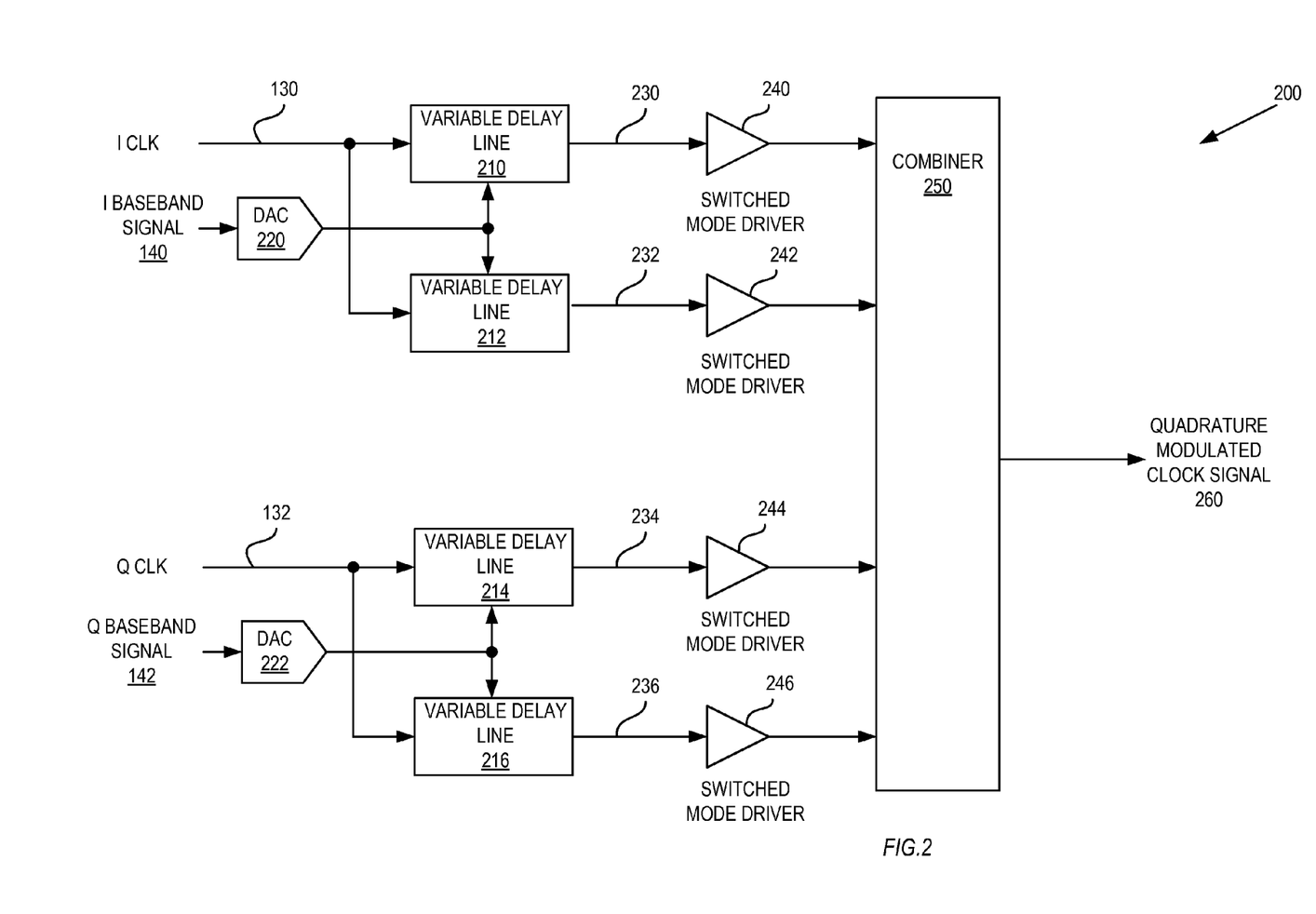
FIG. 2 is a block diagram of one embodiment of a quadrature clock modulator.

FIG. 2 is a block diagram of one embodiment of a quadrature clock modulator 200. The quadrature clock modulator 200 can receive the I CLK signal 130, the Q CLK signal 132, the I baseband signal 140 and the Q baseband signal 142 and generate a quadrature modulated clock signal 260.

In one embodiment, the quadrature clock modulator 200 includes two configurable delay units to process the I CLK signal 130 and the I baseband signal 140. In this embodiment, the configurable delay units are implemented as variable delay lines. In other embodiments, the configurable delay units can be implemented as tapped delay lines, programmable delay lines or any other technically feasible delay unit. A first variable delay line 210 and a second variable delay line 212 can each receive the I CLK signal 130. In this embodiment, the I baseband signal 140 is coupled to the first and the second variable delay lines 210 and 212 through a first digital to analog converter (DAC) 220. The first DAC 220 can convert the I baseband signal 140 from a digital signal to an analog signal. For example, the first DAC 220 can generate an analog voltage signal or analog current signal. The first DAC 220 can convert the I baseband signal 140 into an analog signal for coupling to the first and second variable delay lines 210 and 212.

The first and the second variable delay lines 210 and 212 delay the I CLK signal 130. The first variable delay line 210 is configured to generate a first delayed clock signal 230 with a first delay amount. Similarly, the second variable delay line 212 generates a second delayed clock signal 232 with a second delay amount. The first and the second delay amounts are determined such that the first delayed clock signal 230 is different from the second delayed clock signal 232 by a delay amount δ.

The delay amount δ can be based, at least in part, on the I baseband signal 140. In one embodiment the delay amount δ can be based on I baseband signal values. For example, the I baseband signal 140 can be configured to represent an arbitrary data stream. The I baseband signal 140 can include values, such as numeric values, to represent data stream values. Other examples of I baseband signal 140 values can include integer and floating point numbers, alpha-numeric data, symbol data or any other technically feasible values. If the values of the I baseband signal 140 increase, then the delay amount δ can increase commensurately. Conversely, if values of the I baseband signal 140 decrease, then the delay amount δ can decrease commensurately. Operation of generating the first and the second delayed clock signals 230 and 232 from the first variable delay line 210 and the second variable delay line 212 is described in more detail below in conjunction with FIG. 3.

The delay amount δ can be generated by the first variable delay line 210 and the second variable delay line 212. In one embodiment, the delay amount δ can be split between the first variable delay line 210 and the second variable delay line 212. The delay amounts generated by the first variable delay line 210 and the second variable delay line 212 are combined in a combiner 250. That is, the combiner 250 can combine the delay amounts split between the first variable delay line 210 and the second variable delay line 212. Details regarding the configuration of the first and the second variable delay lines 210 and 212 to provide the delay amount δ and operation of the combiner 250 are described in more detail below in conjunction with FIG. 3. In one embodiment, the delay amount δ is split evenly between the first variable delay line 210 and the second variable delay line 212. In other embodiments, the delay amount δ may be split unevenly between first variable delay line 210 and the second variable delay line 212.

As described above, the delay amount δ is not fixed, but can vary in response to the I baseband signal 140. For example, the I baseband signal 140 can include numeric values to represent a time varying data stream. Since the delay amount δ can vary in response to the I baseband signal 140, in this example, the delay amount δ can be a time varying delay amount.

The first delayed clock signal 230 and the second delayed clock signal 232 are coupled to a first switched mode driver 240 and a second switched mode driver 242 respectively. The first and the second switched mode drivers 240 and 242 can increase the energy of the first and the second delayed clock signals 230 and 232. In one embodiment, the first and the second switched mode drivers 240 and 242 can be class D output drivers. In another embodiment, the first and the second switched mode drivers 240 and 242 can be inverters with high current outputs. The outputs of the first and the second switched mode drivers 240 and 242 can be coupled to the combiner 250. Although the first and the second switched mode drivers 240 and 242 are coupled to the output of the first and the second variable delay lines 210 and 212, in other embodiments, amplification can be provided by different devices coupled to different components. For example, the first delayed clock signal 230 and the second delayed clock signal 232 can be amplified by an amplifier coupled to the output of the combiner 250.

The combiner 250 can combine outputs from the first and the second switched mode drivers 240 and 242. In one embodiment, the combiner 250 can subtract a first output from the second switched mode driver 242 from a second output of the first switched mode driver 240. The operation of combining the outputs of the first and the second switched mode drivers 240 and 242 is described in more detail below in conjunction with FIG. 3.

The Q CLK signal 132 is coupled to a third and fourth variable delay lines 214 and 216 respectively. The Q baseband signal 142 is coupled through a second DAC 222 to the third and the fourth variable delay lines 214 and 216. The third variable delay line 214 generates a third delayed clock signal 234 with a third delay amount. Similarly, the fourth variable delay line 216 generates a fourth delayed clock signal 236 with a fourth delay amount. The third and the fourth delay amounts are determined such that the third delayed clock signal 234 is different from the fourth delayed clock signal 236 by a delay amount based, at least in part, on the Q baseband signal 142. For example if values of the Q baseband signal 142 increase or decrease, then the delay amount based on the Q baseband signal 142 can increase or decrease commensurately.

The third delayed clock signal 234 and the fourth delayed clock signal 236 are coupled to a third switched mode driver 244 and a fourth switched mode driver 246 respectively. The third and the fourth switched mode drivers 244 and 246 can increase the energy of the third and the fourth delayed clock signals 234, and 236. The combiner 250 can receive outputs from the third switched mode driver 244 and the fourth switched mode driver 246 and can combine these outputs with the outputs from the first switched mode driver 240 and the second switched mode driver 242. The output of the combiner 250 is a quadrature modulated clock signal 260.

As described above, processing of the Q CLK signal 132 is similar to the processing of the I CLK signal 130. However, the Q baseband signal 142 can be independent of the I baseband signal 140. Therefore, any delay amounts based on the Q baseband signal 142 can be independent from any delay amounts based on the I baseband signal 140. In one embodiment, elements of the quadrature clock modulator 200 can be symmetric. That is, elements used in processing the I CLK signal 130 and the I baseband signal 140 can be similar to corresponding elements used in processing the Q CLK signal 132 and the Q baseband signal 142. For example, the first switched mode driver 240 can amplify (increase the energy of) signals related to the I CLK signal 130 and the I baseband signal 140 with a similar amount of gain used by the third switched mode driver 244 used to amplify signals related to the Q CLK signal 132 and the Q baseband signal 142. In another embodiment, elements of the quadrature clock modulator 200 can be non-symmetric.

Figure 3:
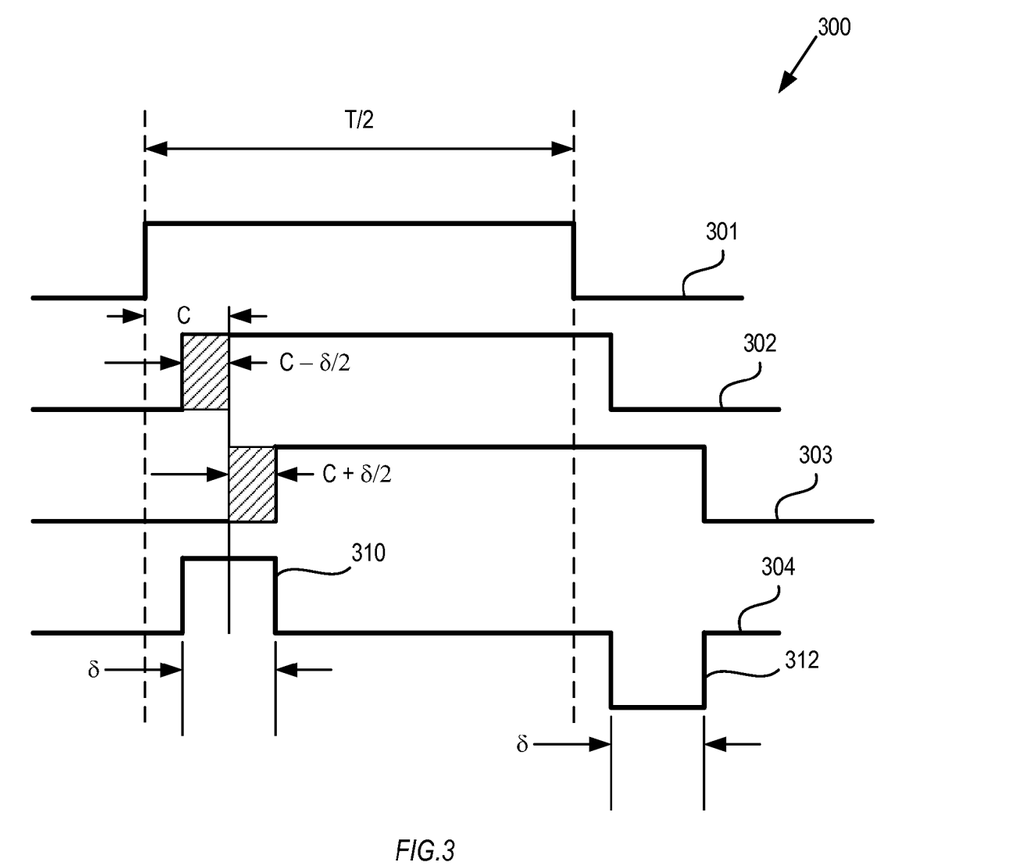
FIG. 3 is a waveform diagram depicting example waveform shapes and timing relationships of clocks signals.

FIG. 3 is a waveform diagram 300 depicting example waveform shapes and timing relationships of clock signals. In particular, waveform diagram 300 shows a relationship between the clock signals, the delayed clock signals and a combination of the delayed clock signals that may be found in the quadrature clock modulator 200 of FIG. 2. A partial clock waveform 301 is shown at the top of the waveform diagram 300. The clock waveform 301 can have a period T and can have a duty cycle of approximately fifty percent. Thus, the portion of the clock waveform 301 shown between the dashed lines is approximately one-half of the period T of the clock waveform 301. The I CLK signal 130 and the Q CLK signal 132 can have a waveform similar to the clock waveform 301.

As a clock signal, such as I CLK signal 130, is delayed by the first variable delay line 210 and the second variable delay line 212, the first delayed clock signal 230 and the second delayed clock signal 232 are generated respectively. As described above, the I baseband signal 140 is coupled to the first variable delay line 210 and the second variable delay line 212. In one embodiment, a delay amount δ responsive to the I baseband signal 140 can be distributed between the first and the second variable delay lines 210 and 212. For example, a delay of −(δ/2) can be provided by the first variable delay line 210 and a delay of +(δ/2) can be provided by the second variable delay line 212. Since negative delay amounts can be difficult to generate, in one embodiment, a fixed time constant C can be introduced by both the first variable delay line 210 and the second variable delay line 212. The fixed time constant C can help configure the first variable delay line 210 and the second variable delay line 212 to generate positive delays amounts. For example, if the fixed time constant C is greater than the delay amount δ, then subtraction of a portion of the delay amount (such as (δ/2)) will result in a positive delay amount to be generated by either the first variable delay line 210 or the second variable delay line 212.

Returning to FIG. 3, waveform 302 can represent the first delayed clock signal 230 from the first variable delay line 210. In this example, the first variable delay line 210 provides a delay amount of C−(δ/2). The shaded region in waveform 302 highlights the delay amount of C−(δ/2). Waveform 303 can represent the second delayed clock signal 232 from the second variable delay line 212. As shown, the second variable delay line 212 provides a delay amount of C+(δ/2). The shaded region in waveform 303 highlights the delay amount of C+(δ/2). The waveforms 302 and 303 can be combined to form a modulated clock signal. In one embodiment, the waveforms 302 and 303 can be combined in the combiner 250 of FIG. 2. One embodiment of a combined waveform is shown in waveform 304. The waveform 304 can be produced by subtracting waveform 303 from waveform 302. Note that in one embodiment, combined waveform 304 can include a positive pulse 310 and a negative pulse 312. The positive pulse 310 and the negative pulse 312 each have a pulse width of δ as shown.

Waveform diagram 300 depicts one approach for implementing a delay amount δ responsive to a baseband signal. In another embodiment, the delay amount δ does not need to be distributed evenly between the first variable delay line 210 and the second variable delay line 212, but instead the delay amount δ can be unevenly divided.

The waveform 304 depicts a combination of two clock signals (waveforms 302 and 303). The clock signal shown in waveform 302 and the clock signal shown in waveform 303 have each been delayed such that the delay amount between the two clock signals is δ. As described above, the delay amount δ can be based, at least in part on a signal, such as the I baseband signal 140 or the Q baseband signal 142. That is, the delay amount δ can vary as the signal I baseband signal 140 or the Q baseband signal 142 varies.

Figure 4:
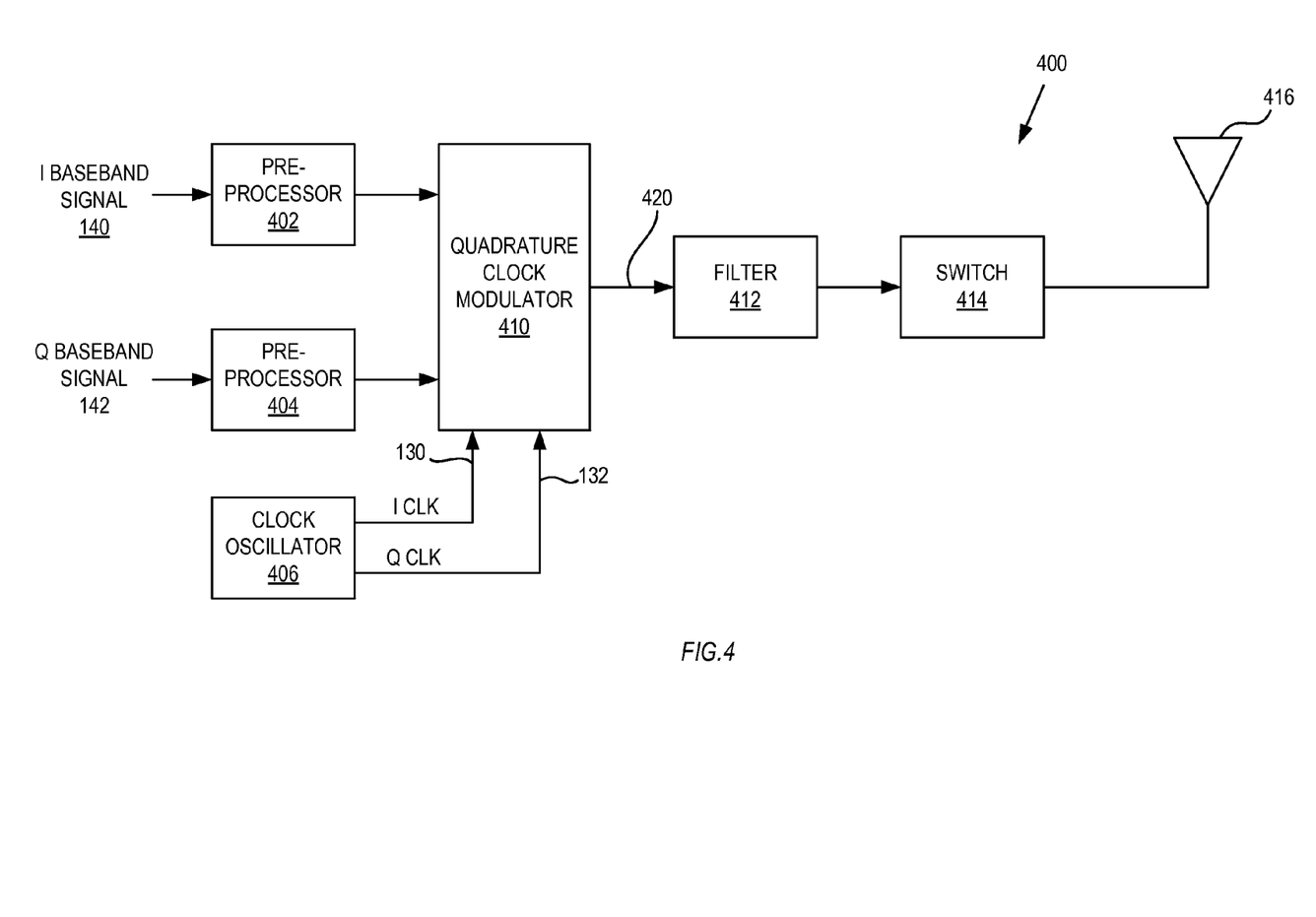
FIG. 4 is a block diagram depicting one embodiment of a transmitter including a quadrature clock modulator.

FIG. 4 is a block diagram depicting one embodiment of a transmitter 400 including a quadrature clock modulator 410. The quadrature clock modulator 410 can operate in a similar manner as the quadrature clock modulator 200 of FIG. 2. The transmitter 400 can include a clock oscillator 406, which can generate the I CLK signal 130 and the Q CLK signal 132. The I CLK signal 130 and the Q CLK signal 132 can be coupled to the quadrature clock modulator 410. In one embodiment, the Q CLK signal 132 can be a phase-shifted version of the I CLK signal 130. For example, the I CLK signal 130 can be phase-shifted by approximately ninety-degrees with respect to the Q CLK signal 132. In other embodiments, other phase shifts are possible. For example, the I CLK signal 130 can be phase-shifted from the Q CLK signal 132 by one hundred and eighty-degrees.

The transmitter 400 can receive the I baseband signal 140 and the Q baseband signal 142. The I baseband signal 140 is coupled to the quadrature clock modulator 410 through a first pre-processor 402. Similarly, the Q baseband signal 142 is coupled to the quadrature clock modulator 410 through a second pre-processor 404. The first and the second pre-processors 402 and 404 can provide an adjustment or a correction to the operation of the transmitter 400. For example, the first and the second pre-processors 402 and 404 can apply a pre-distortion to the I baseband signal 140 and/or the Q baseband signal 142 to compensate for, or correct a distortion that is introduced by processing in the transmitter 400. In one embodiment, the first pre-processor 402 and/or the second pre-processor 404 can include a look-up table. The first pre-processor 402 and/or the second pre-processor 404 can be configured to receive a baseband signal and generate a corrected baseband signal based on information included in the look-up table. For example, the information in the look-up table can describe a pre-distortion or a correction function.

As described above in FIG. 2, the quadrature clock modulator 410 can generate a quadrature modulated clock signal 420. The quadrature clock modulator 410 can include one or more drivers, such as the first, second, third and fourth switched mode drivers 240-246. The first, second, third and fourth switched mode drivers 240-246 can add energy to signals within the quadrature clock modulator 410, which can enable transmission of the quadrature modulated clock signal 420 through a communication medium.

The quadrature modulated clock signal 420 is coupled to a filter 412. The filter 412 can have a high-pass, a low-pass or a band-pass filter profile. In some embodiments, the filter 412 can include a combination of two or more filter profiles. The output of the filter 412 can be coupled to a switch 414. The switch 414 can couple or disconnect the output of the filter 412 from an antenna 416. In one embodiment, the switch 414 can be a transmit/receive switch used to isolate a receiver (not shown) from the antenna 416.

Figure 5:
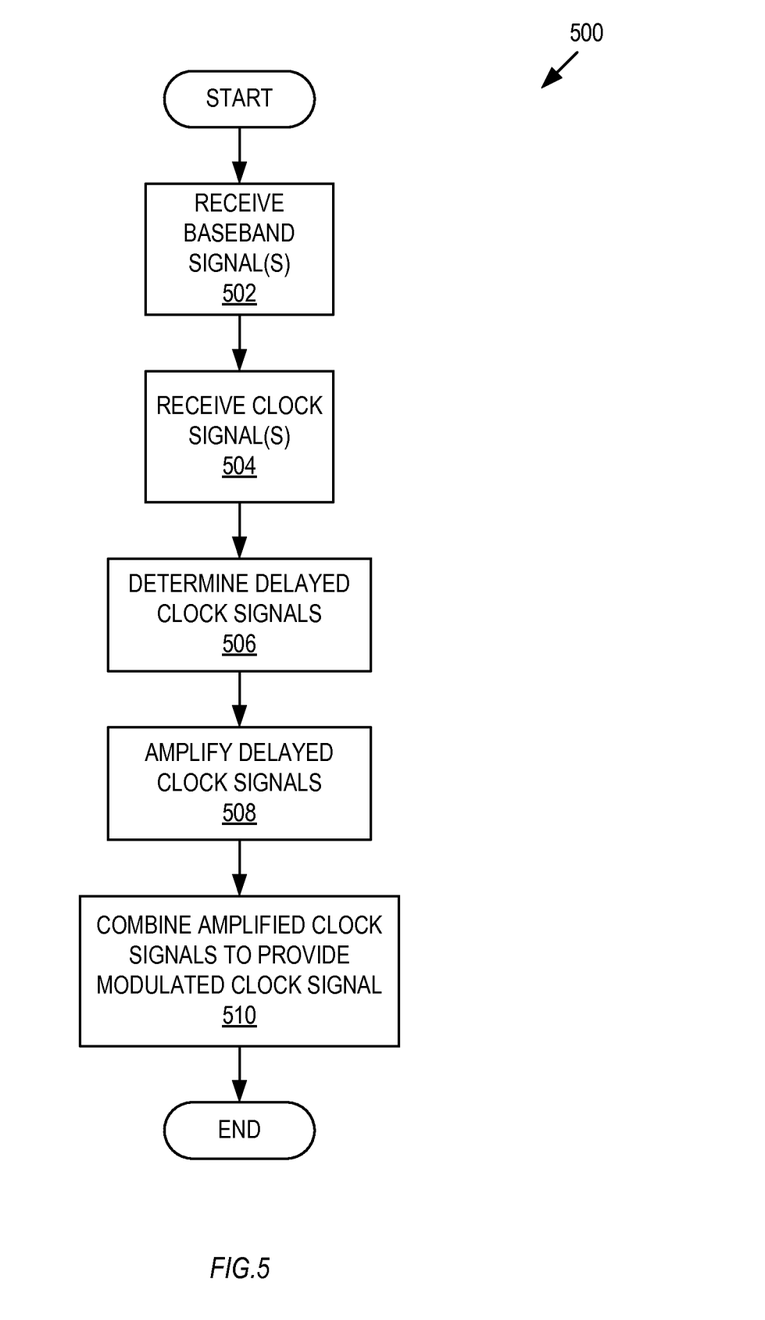
FIG. 5 is a flow diagram illustrating example operations for providing a modulated clock signal.

FIG. 5 is a flow diagram 500 illustrating example operations for providing a modulated clock signal. The example operations can be carried out by one or more components in the quadrature clock modulator 200 or transmitter 400. The flow begins in block 502 when a baseband signal is received. In one embodiment, the received baseband signal can be the I baseband signal 140 or the Q baseband signal 142. In another embodiment, the received baseband signal can include both the I baseband signal 140 and the Q baseband signal 142. Proceeding to block 504, a clock signal is received. In one embodiment, the received clock signal can be the I CLK signal 130 or the Q CLK signal 132. In another embodiment, the received clock signal can include both the I CLK signal 130 and the Q CLK signal 132.

Proceeding to block 506, delayed clock signals are determined. In one embodiment, the first delayed clock signal 230 and the second delayed clock signal 232 are determined. In another embodiment, the third delayed clock signal 234, and the fourth delayed clock signal 236 can be determined in addition to the first and the second delayed clock signals 230 and 232. As described above, the delay amount for the clock signals can be based, at least in part, on a baseband signal. In one embodiment, the delay amount for the first delayed clock signal 230 and the second delayed clock signal 232 can be based on the I baseband signal 140 and the delay amount for the third delayed clock signal 234 and the fourth delayed clock signal 236 can be based on the Q baseband signal 142. The delay amount in the first delayed clock signal 230 can be different from the delay amount in the second delayed clock signal 232. The delay amount for the third delayed clock signal 234 can be different from the delay amount for the fourth delayed clock signal 236.

Proceeding to block 508, the delayed clock signals can be amplified. In one embodiment, the first delayed clock signal 230 and the second delayed clock signal 232 can be amplified. In another embodiment, the third delayed clock signal 234 and the fourth delayed clock signal 236 can be amplified in addition to the first and the second delayed clock signals 230 and 232. In one embodiment, the delayed clock signals can be amplified via switched mode drivers, such as class D output drivers. In other embodiments, the delayed clock signals can be amplified with an inverter. In still other embodiments, any technically feasible amplifiers can be used.

Proceeding to block 510, the amplified delayed clock signals can be combined to generate a modulated clock signal and the flow can end. In one embodiment, the combiner 250 can combine the amplified delayed clock signals from the first switched mode driver 240 and the second switched mode driver 242. In another embodiment, the combiner 250 can combine the amplified delayed clock signals from first switched mode driver 240, the second switched mode driver 242, the third switched mode driver 244 and the fourth switched mode driver 246. In one embodiment, the amplified delayed clock signals can be combined by subtracting the first amplified delayed clock signal from the second amplified delayed clock signal. In another embodiment, the amplified delayed clock signals can be combined by subtracting the first amplified delayed clock signal from the second amplified delayed clock signal to generate a first difference signal. The third amplified delayed clock signal can be subtracted from the fourth amplified delayed clock signal to generate a second difference signal. The first difference signal and the second difference signal can be combined together thereby combining all four amplified delayed clock signals.

FIGS. 1-5 and the operations described herein are examples meant to aid in the understanding of the embodiments and should not be used to limit the scope of the embodiments or the claims. Embodiments may perform additional operations, fewer operations, operations in a different order, operations in parallel, and some operations differently. For example, the clock signal can be received in block 504 before the baseband signal is received in block 502.

As will be appreciated by one skilled in the art, aspects of the present inventive subject matter may be embodied as a system, method, or computer program product. Accordingly, aspects of the present inventive subject matter may take the form of an entirely hardware embodiment, a software embodiment (including firmware, resident software, microcode, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be used. The computer readable medium may be a computer readable storage medium. A computer readable storage medium may be, for example, an electronic, magnetic, optical, electromagnetic, infrared, or semiconductor system, apparatus, or device, or any suitable combination of the foregoing. More specific examples of the computer readable storage medium may include a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

The computer readable medium can include instructions for carrying out operations for aspects of the present inventive subject matter and may be written in any combination of one or more programming languages. Examples of programming languages can include an object oriented programming language such as Java, Smalltalk, C++ or the like and conventional procedural programming languages, such as the "C" programming language. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to be executed.

The computer program instructions can be executed to direct a computer, other programmable data processing apparatus, or other devices to function in a particular manner in order to produce an article of manufacture including instructions which implement the function/act specified in the flowchart and/or block diagram block or blocks.

The computer program instructions may also be loaded onto a computer, other programmable data processing apparatus, or other devices. The computer program instructions can be executed to cause a series of operational steps to be performed to produce a computer implemented process such that the executed instructions can provide processes for implementing the functions/acts specified in the flowchart and/or block diagram block or blocks.

Figure 6:
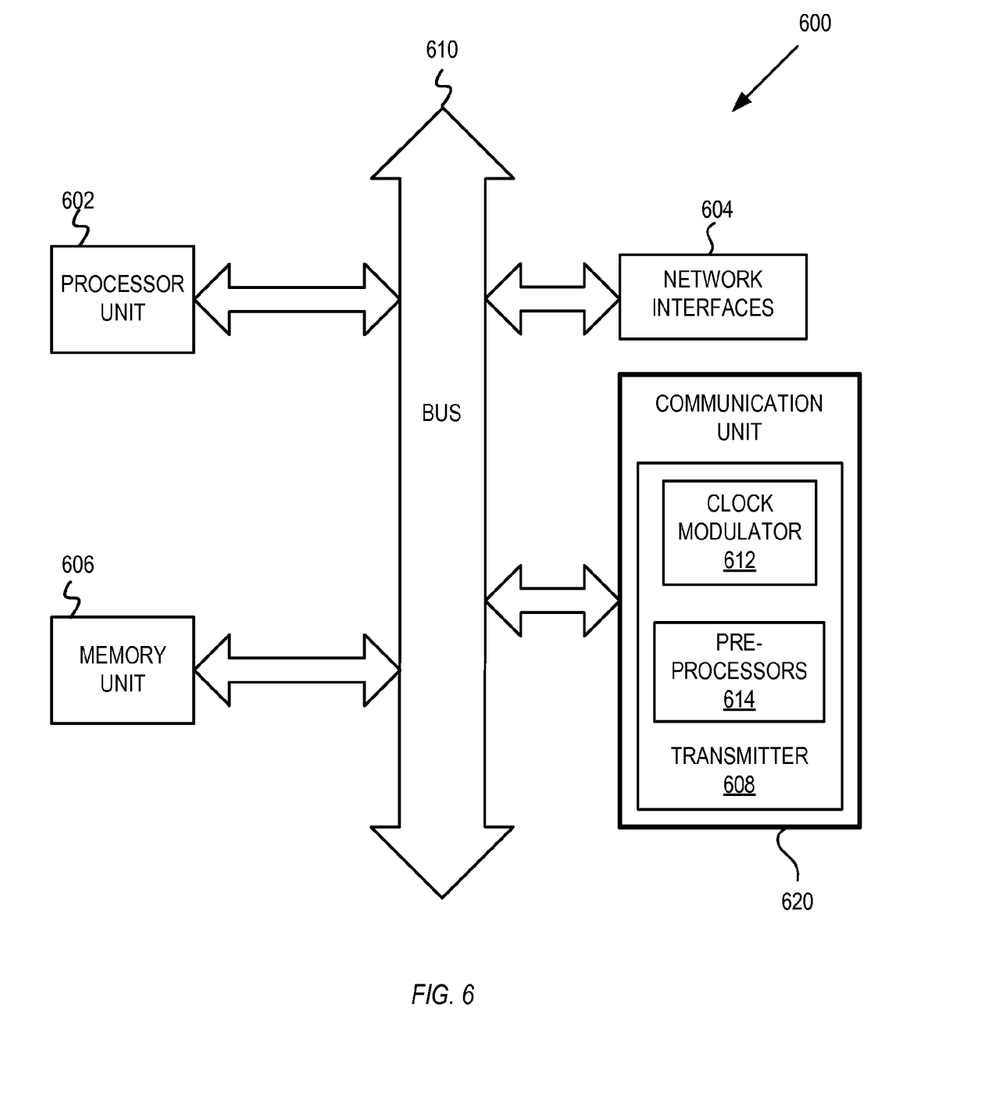
FIG. 6 is a block diagram of an exemplary embodiment of an electronic device including a quadrature clock modulator.

FIG. 6 is a block diagram of an exemplary embodiment of an electronic device 600 including a clock modulator 612. In some implementations, the electronic device 600 may be one of a laptop computer, a tablet computer, a mobile phone, a powerline communication device, a smart appliance (PDA), access point, wireless station or other electronic systems. The electronic device 600 can include processor unit 602 (possibly including multiple processors, multiple cores, multiple nodes, and/or implementing multi-threading, etc.). The electronic device 600 can also include memory unit 606. Memory unit 606 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. Electronic device 600 can include bus 610 (e.g., PCI, ISA, PCI-Express, HyperTransport®, InfiniBand®, NuBus, AHB, AXI, etc.). Electronic device 600 can include a network interface 604 that includes at least one of a wireless network interface (e.g., a WLAN interface, a BLUETOOTH® interface, a WiMAX interface, a ZigBee® interface, a Wireless USB interface, etc.) and a wired network interface (e.g., an Ethernet interface, a powerline communication interface, etc.). In some implementations, electronic device 600 may support multiple network interfaces—each of which is configured to couple the electronic device 600 to a different communication network.

The electronic device 600 can include a communication unit 620. The communication unit 620 can include a radio or hybrid radios with transmitters and receivers for wired and wireless networking. For example, the communication unit 620 can include a transmitter 608. The transmitter 608 can be similar to the transmitter 400 as described above. The transmitter 608 can include the clock modulator 612. The transmitter 608 can transmit a modulated clock signal. The clock modulator 612 can be similar to the quadrature clock modulator 200 described above. The transmitter 608 can also include one or more pre-processors 614. The pre-processors 614 can be similar to the first and the second pre-processors 402 and 404 described above. The pre-processors 614 can correct or pre-distort signals, such as baseband signals to compensate for distortion caused by the clock modulator 612. In some embodiments, other portions of the transmitter 608 can be distributed within the processor unit 602, the memory unit 606 and the bus 610.

The memory unit 606 can embody functionality to implement embodiments described in FIGS. 1-5 above. In one embodiment, memory unit 606 can include one or more functionalities that facilitate providing two or more delayed clock signals, where the delay amount of the delayed clock signals is based, at least in part, on a baseband signal. In other embodiment, the memory unit 606 can be used to implement a look-up table that can provide at least a portion of the functionality of the pre-processors 614.

Any one of these functionalities may be partially (or entirely) implemented in hardware and/or on the processor unit 602. For example, the functionality may be implemented with an application specific integrated circuit, in logic implemented in the processor unit 602, in a co-processor on a peripheral device or card, etc. Further, realizations may include fewer or additional components not illustrated in FIG. 6 (e.g., video cards, audio cards, additional network interfaces, peripheral devices, etc.). The processor unit 602, the memory unit 606, the network interface 604 are coupled to bus 610. Although illustrated as being coupled to the bus 610, the memory unit 606 may be coupled to the processor unit 602.

While the embodiments are described with reference to various implementations and exploitations, it will be understood that these embodiments are illustrative and that the scope of the inventive subject matter is not limited to them. In general, techniques for providing delayed clock signals and combining the delayed clock signals as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A device comprising:
a first configurable delay unit configured to receive a first clock signal and a first baseband signal and to generate a first delayed clock signal based, at least in part, on the first baseband signal;
a second configurable delay unit configured to receive the first clock signal and the first baseband signal and to generate a second delayed clock signal based, at least in part, on the first baseband signal, wherein the second delayed clock signal is different from the first delayed clock signal; and
a combiner configured to combine the first delayed clock signal and the second delayed clock signal to generate a modulated clock signal.

2. The device of claim 1, wherein the first configurable delay unit is further configured to delay the first clock signal by a first delay amount to generate the first delayed clock signal wherein the first delay amount is based, at least in part, on the first baseband signal.

3. The device of claim 2, wherein the second configurable delay unit is further configured to delay the first clock signal by a second delay amount to generate the second delayed clock signal, wherein the second delay amount is based, at least in part, on the first baseband signal.

4. The device of claim 1, wherein the combiner is further configured to generate the modulated clock signal with a pulse having a pulse width based, at least in part, on the first baseband signal.

5. The device of claim 4, wherein the pulse width is based, at least in part, on a sum of a first delay amount and a second delay amount, wherein the first delay amount and the second delay amount are based, at least in part, on the first baseband signal.

6. The device of claim 1, further comprising:
a first driver configured to receive the first delayed clock signal and to generate a first amplified delayed clock signal; and
a second driver configured to receive the second delayed clock signal and to generate a second amplified delayed clock signal,
wherein the combiner is further configured to combine the first amplified delayed clock signal and the second amplified delayed clock signal to generate the modulated clock signal.

7. The device of claim 6, wherein the first driver and the second driver are switched mode drivers.

8. The device of claim 1, further comprising a digital to analog converter coupled with the first configurable delay unit, the digital to analog converter configured to receive the first baseband signal and provide an analog signal to the first configurable delay unit, wherein the first configurable delay unit is further configured to generate the first delayed clock signal based, at least in part, on the analog signal.

9. The device of claim 1, wherein the combiner is further configured to combine the first delayed clock signal and the second delayed clock signal by subtracting the first delayed clock signal from the second delayed clock signal to generate the modulated clock signal.

10. The device of claim 1, further comprising:
a third configurable delay unit configured to receive a second clock signal and a second baseband signal and to generate a third delayed clock signal based, at least in part, on the second baseband signal; and
a fourth configurable delay unit configured to receive the second clock signal and the second baseband signal and to generate a fourth delayed clock signal based, at least in part, on the second baseband signal,
wherein the combiner is further configured to combine the first delayed clock signal, the second delayed clock signal, the third delayed clock signal and the fourth delayed clock signal to generate the modulated clock signal.

11. The device of claim 10, where the second clock signal is related to the first clock signal by a phase shift.

12. A method comprising:
receiving a first clock signal;
receiving a first baseband signal;
generating a first delayed clock signal based, at least in part, on the first baseband signal and the first clock signal;
generating a second delayed clock signal based, at least in part, on the first baseband signal and the first clock signal, wherein the first delayed clock signal is different from the second delayed clock signal; and
combining the first delayed clock signal and the second delayed clock signal to generate a modulated clock signal.

13. The method of claim 12, wherein generating the first delayed clock signal further comprises delaying the first clock signal by a first delay amount, wherein the first delay amount is based, at least in part, on the first baseband signal.

14. The method of claim 13, wherein generating the second delayed clock signal further comprises delaying the first clock signal by a second delay amount, wherein the second delay amount is based, at least in part, on the first baseband signal.

15. The method of claim 12, wherein the modulated clock signal includes a pulse having a pulse width based, at least in part, on the first baseband signal.

16. The method of claim 15, wherein the pulse width is based, at least in part, on a sum of a first delay amount and a second delay amount, wherein the first delay amount and the second delay amount are based, at least in part, on the first baseband signal.

17. The method of claim 12, further comprising:
amplifying the first delayed clock signal; and
amplifying the second delayed clock signal,
wherein the combining the first delayed clock signal and the second delayed clock signal further comprises combining a first amplified delayed clock signal and a second amplified delayed clock signal to generate the modulated clock signal.

18. The method of claim 17, wherein amplifying the first delayed clock signal further comprises amplifying through a switched mode driver.

19. The method of claim 12, wherein the combining further comprises subtracting the first delayed clock signal from the second delayed clock signal to generate the modulated clock signal.

20. The method of claim 12, further comprising:
receiving a second clock signal;
receiving a second baseband signal;
generating a third delayed clock signal based, at least in part, on the second baseband signal and the second clock signal; and
generating a fourth delayed clock signal based, at least in part, on the second baseband signal and the second clock signal,
wherein the combining further comprises combining the first delayed clock signal, the second delayed clock signal, the third delayed clock signal and the fourth delayed clock signal to generate the modulated clock signal.

21. The method of claim 20, wherein the second clock signal is related to the first clock signal by a phase shift.

22. A system comprising:
a modulator for generating a modulated clock signal, the modulator comprising:
a first configurable delay unit configured to receive a first clock signal and a first baseband signal and to generate a first delayed clock signal based, at least in part, on the first baseband signal,
a second configurable delay unit configured to receive the first clock signal and the first baseband signal and to generate a second delayed clock signal based, at least in part, on the first baseband signal wherein the second delayed clock signal is different from the first delayed clock signal, and
a combiner configured to generate the modulated clock signal based, at least in part, on the first delayed clock signal and the second delayed clock signal.

23. The system of claim 22, further comprising:
a pre-processor configured to receive the first baseband signal and to provide a modified first baseband signal to the first configurable delay unit.

24. The system of claim 23, wherein the pre-processor is configured to pre-distort the first baseband signal.

25. The system of claim 22, further comprising:
a first driver configured to receive the first delayed clock signal and to generate a first amplified delayed clock signal; and
a second driver configured to receive the second delayed clock signal and to generate a second amplified delayed clock signal,
wherein the combiner is further configured to combine the first amplified delayed clock signal and the second amplified delayed clock signal to generate the modulated clock signal.

26. The system of claim 22, wherein the modulator further comprises:
a third configurable delay unit configured to receive a second clock signal and a second baseband signal and to generate a third delayed clock signal based, at least in part, on the second baseband signal,
a fourth configurable delay unit configured to receive the second clock signal and the second baseband signal and to generate a fourth delayed clock signal based, at least in part, on the second baseband signal,
wherein the combiner is further configured to combine the first delayed clock signal, the second delayed clock signal, the third delayed clock signal and the fourth delayed clock signal to generate the modulated clock signal.

27. The system of claim 22, further comprising:
an antenna configured to transmit the modulated clock signal; and
a switch configured to selectively couple the modulated clock signal to the antenna.

28. The system of claim 27, further comprising a filter configured to receive the modulated clock signal from the modulator and to provide a filtered modulated clock signal to the switch.

29. The system of claim 28 wherein the filter has at least one of a low-pass, a band-pass and a high-pass filter profile.

30. A non-transitory machine-readable storage media having machine executable instructions stored therein, the machine executable instructions comprising instructions to:
receive a first clock signal;
receive a first baseband signal;
generate a first delayed clock signal with a first delay amount based, at least in part, on the first baseband signal and the first clock signal;
generate a second delayed clock signal with a second delay amount based, at least in part, on the first baseband signal and the first clock signal, wherein the first delay amount is different from the second delay amount; and
combine the first delayed clock signal and the second delayed clock signal to generate a modulated clock signal.

* * * * *